(12) United States Patent
Zhou et al.

(10) Patent No.: US 11,736,821 B1
(45) Date of Patent: Aug. 22, 2023

(54) FOUR SHARED PIXEL WITH PHASE DETECTION AND HORIZONTAL AND VERTICAL BINNING READOUT MODES

(71) Applicant: SmartSens Technology (HK) Co., Ltd, Kwun Tong Kowloon (HK)

(72) Inventors: Zhi Zhou, Shanghai (CN); Guanjing Ren, Shanghai (CN)

(73) Assignee: SmartSens Technology (HK) Co., Ltd.

( * ) Notice: Subject to any disclaimer, the term of this patent is extended or adjusted under 35 U.S.C. 154(b) by 0 days.

(21) Appl. No.: 17/854,883

(22) Filed: Jun. 30, 2022

(30) Foreign Application Priority Data

Mar. 1, 2022 (CN) .......................... 202210195434.6
Mar. 1, 2022 (CN) .......................... 202220430412.9

(51) Int. Cl.
*H04N 25/46* (2023.01)
*H01L 27/146* (2006.01)
*H04N 25/11* (2023.01)
*H04N 25/42* (2023.01)
*G02B 3/00* (2006.01)
*H04N 23/84* (2023.01)
*H04N 25/74* (2023.01)
*H04N 25/75* (2023.01)
*H04N 25/704* (2023.01)
*H04N 25/778* (2023.01)

(52) U.S. Cl.
CPC ............... *H04N 25/46* (2023.01); *G02B 3/00* (2013.01); *H01L 27/14627* (2013.01); *H04N 23/84* (2023.01); *H04N 25/11* (2023.01); *H04N 25/42* (2023.01); *H04N 25/704* (2023.01); *H04N 25/74* (2023.01); *H04N 25/75* (2023.01); *H04N 25/778* (2023.01); *G02B 2003/0093* (2013.01); *H01L 27/14641* (2013.01); *H01L 27/14643* (2013.01)

(58) Field of Classification Search
CPC ........ H04N 25/46; H04N 23/84; H04N 25/11; H04N 25/42; H04N 25/704; H04N 25/74; H04N 25/75; H04N 25/778; G02B 3/00; G02B 2003/0093; H01L 27/14627; H01L 27/14641; H01L 27/14643
See application file for complete search history.

(56) References Cited

U.S. PATENT DOCUMENTS

| | | | |
|---|---|---|---|
| 11,190,716 B2 * | 11/2021 | Kim | H04N 25/704 |
| 11,265,496 B2 * | 3/2022 | Kim | H01L 27/14643 |
| 11,425,325 B2 * | 8/2022 | Kasugai | H04N 25/75 |
| 2018/0352199 A1 * | 12/2018 | Hwang | H04N 9/01 |
| 2020/0328238 A1 * | 10/2020 | Shim | H01L 27/1463 |
| 2021/0120168 A1 * | 4/2021 | Shim | H01L 27/14603 |
| 2021/0175269 A1 * | 6/2021 | Fujita | H04N 25/709 |
| 2022/0303509 A1 * | 9/2022 | Pyo | H04N 25/133 |

* cited by examiner

*Primary Examiner* — Shahbaz Nazrul
(74) *Attorney, Agent, or Firm* — Eric Karich; Karich & Associates (57) ABSTRACT

An imaging system with an array of pixel cell units having four photodiodes sharing the same readout amplifier, row select transistor, microlens and filter color. Some pixel cell units provide a phase detection autofocus function. The imaging system provides the option of imaging with phase detection autofocus and with or without horizontal or vertical binning readout modes, or both simultaneously, to form an a full resolution image of the target scene with improved effective frame rate and improved slow motion imaging.

18 Claims, 10 Drawing Sheets

FOUR SHARED PIXEL WITH PHASE DETECTION AND HORIZONTAL AND VERTICAL BINNING READOUT MODES

BACKGROUND OF THE INVENTION

Field of the Invention:

This invention relates generally to image sensors, and in particular to CMOS image sensors with phase detection pixels to perform autofocus. The phase detection pixels consist of four photodiodes sharing the same readout amplifier, row select transistor, microlens and filter color. Optional readout modes including horizontal or vertical binning, or both simultaneously, are incorporated to improve framerate and better capture the details of slow motion imaging. The image sensor may be incorporated within a digital camera.

Description OF Related Art:

An image capture device includes an image sensor and an imaging lens. The imaging lens focuses light onto the image sensor to form an image, and the image sensor converts the light into electrical signals. The electrical signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate.

With the decreased pixel size, the total light absorbed within the pixel becomes diminished and some advanced features such as phase difference detection autofocus become challenged. In phase difference detection autofocus technology it is known to use pixels comprising two half masked photodiodes, each under nearby respective microlenses, wherein the single photodiodes in each pixel receive light from nearby points on the object but arriving at different angles. When masked photodiode pixels are used and when a scene is out of focus the phase detection photodiode mask phase shifts the light slightly. The distance between a pair of phase detection pixels, combined with their relative shifts, can be used to calculate how far an optical assembly needs to move a lens element to bring the scene into focus. Partially masking a photodiode of decreased size further reduces pixel signal with no decrease in signal noise, thereby reducing signal to noise. A monochrome color filter is configured to extend over both of the adjacent photodiodes so that both receive the same wavelength of light. The two adjacent photodiodes are positioned under the single microlens such that light incident in a first direction is collected in a first photodiode of the two adjacent photodiodes and light incident in a second direction is collected in a second photodiode of the two adjacent photodiodes. An image signal processor may perform phase detection autofocus using values received from the two adjacent photodiodes.

An opportunity for improvement of phase detection autofocus combined with increased image sensor resolution arises when autofocus readout includes horizontal or vertical binning, or both simultaneously. The present invention fulfills these needs and provides further advantages as described in the following summary.

SUMMARY OF THE INVENTION

The present invention teaches certain benefits in construction and use which give rise to the objectives described below.

The present invention provides an imaging system comprising an array of pixel cells, each pixel cell unit sharing the same readout amplifier, row select transistor, microlens and color filter. The four photodiodes are configured to operate in two adjacent pairs wherein the two adjacent pairs of photodiodes are positioned under the single microlens such that light incident in a first direction is collected in a first pair of photodiodes of the two adjacent pairs of photodiodes and light incident in a second direction is collected in a second pair of photodiodes of the two adjacent pairs of photodiodes. The microlens has a plano-convex shape which causes light to be incident in two directions on photodiodes positioned under each of two sides of the microlens. Some pixel cell units provide a phase detection autofocus function. The imaging system provides the option of imaging with phase detection autofocus and with or without horizontal or vertical binning readout modes, or both simultaneously, to form an a full resolution image of the target scene with improved effective frame rate and improved slow motion imaging.

A primary objective of the present invention is to provide an image sensor pixel having advantages not taught by the prior art.

It is known in the prior art to configure two adjacent photodiodes under a single microlens and filter but image sensor resolution becomes limited as photodiode size decreases and discrimination between the signals from the adjacent photodiodes becomes inadequate for effective autofocus functioning. An objective of the present invention is to configure four photodiodes under the same microlens and filter and to bin or combine the signals from photodiodes within pairs of the photodiodes during autofocus to improve autofocus function while also providing for increased image sensor effective imaging frame rate as well as improved slow-motion image capture and dynamic range. This is principally achieved through the use of two row select lines along with associated timing controls delivered by three row select signal lines to realize horizontal binning along with a phase detection autofocus function.

An alternate embodiment of the invention provides a pixel cell and a two bit line readout scheme that provide for an image sensor capable of vertical binning to improve image sensor effective imaging frame rate as well as improved slow-motion image capture and dynamic range.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

Figure 1:
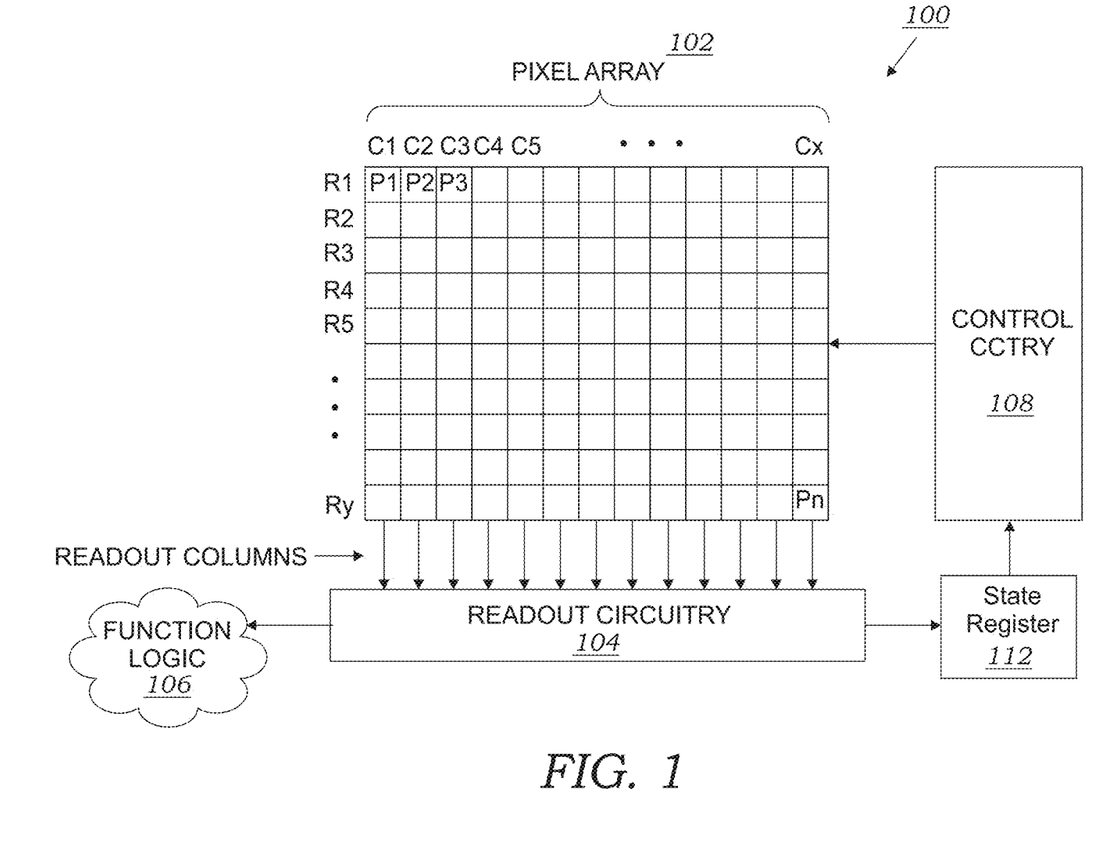
FIG. 1 is a diagram illustrating one example of an imaging system including a pixel cell array having pixel cell units included in an integrated circuit system according to one embodiment of the present invention.

The above-described drawing figures illustrate the invention, an imaging system comprising pixel cell units or groups, each comprising four phase detection photodiodes sharing the same readout amplifier, row select transistor, microlens and filter color. Various embodiments of the imaging system are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. FIG. 1 is a diagram illustrating one example of an imaging system 100 including an example pixel array 102 having a plurality of image sensor pixel cells included in an example integrated circuit system with features in accordance with the teachings of the present invention. As shown in the depicted example, imaging system 100 includes pixel array 102 coupled to control circuitry 108 and readout circuitry 104, which is coupled to function logic 106. Control circuitry 108 and readout circuitry 104 are in addition coupled to state register 112. In one example, control circuitry 108 is coupled to pixel array 102 to control operational characteristics of pixel array 102. Some aspects of the operation of control circuitry 108 may be determined by settings present in state register 112. In one example, pixel array 102 is a two-dimensional (2D) array of image sensor pixels (e.g., pixels P1, P2 . . . , Pn).

As illustrated in FIG. 1, each pixel may be arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 using a readout mode specified by state register 112 and then transferred to function logic 106. In various examples, readout circuitry 104 may include amplification circuitry, analog-to-digital (ADC) conversion circuitry, or otherwise. In one example of the present invention, state register 112 may include a digitally programmed selection system to determine whether readout mode is for an autofocus function or a full resolution imaging function.

Function logic 106 may simply store the image data or even manipulate the image data by applying post image effects (e.g., crop, rotate, remove red eye, adjust brightness, adjust contrast, or otherwise). For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. In one example of the present invention, control circuitry 108 and readout circuitry 104 may generate and readout a row of image data containing phase detection autofocus related signals which are processed by suitable function logic to provide autofocus functions to an imaging system. In an example of the present invention control circuitry 108 may generate control signals to combine or bin image signals from photodiodes arranged in pairs for use in a phase detection autofocus function. In another example of the present invention control circuitry 108 may generate control signals to capture image signals from each photodiode without combination or binning for use in providing a full resolution image from the image array.

Figure 2:
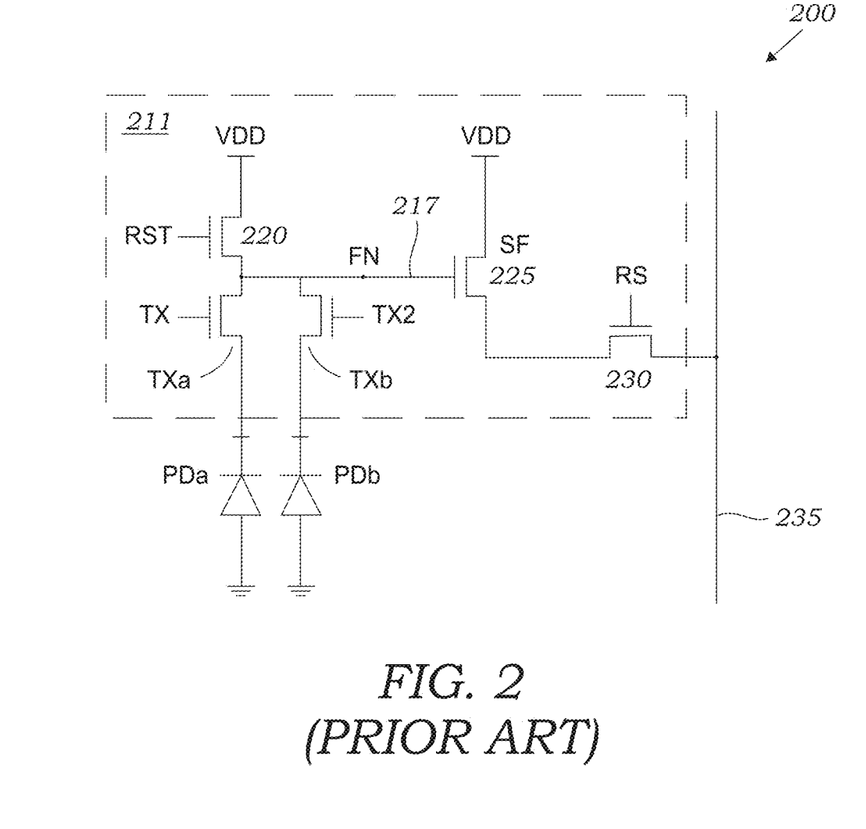
FIG. 2 is an electrical schematic that illustrates one example of an image sensor pixel cell with one pair of phase detection photodiodes found in the prior art.

FIG. 2 is an electrical schematic that illustrates an image sensor pixel cell from the prior art, with shared phase detection photodiodes with rolling shutter readout. This figure and example pixel are provided to simplify explanation of pixel operation in anticipation of a description of an example of the present invention. Each sensor pixel 200 includes a photodiode PDa (e.g., photosensitive element) and a photodiode PDb and pixel support circuitry 211 as shown. Photodiodes PDa and PDb may be "pinned" photodiodes as is commonly present in CMOS image sensors. In one example, pixel support circuitry 211 includes a reset transistor 220, a row select transistor 230, and a source follower (SF) amplifier transistor 225 coupled to transfer transistors TXa and TXb which control their respective photodiodes PDa and PDb. During operation, photodiode PDa photo-generates charge in response to light incident from a first direction during an exposure period. Transfer transistor TXa is coupled to receive a transfer signal TX1, which causes transfer transistor TXa to transfer the charge accumulated in photodiode PDa to floating diffusion (FN) node 217. In a separate sequence photodiode PDb photo-generates charge in response to light incident from a second direction during an exposure period. Transfer transistor TXb is coupled to receive a transfer signal TX2, which causes transfer transistor TXb to transfer the charge accumulated in photodiode PDb to floating diffusion (FN) node 217. Floating diffusion 217 is in effect the drain of the transfer transistors while the photodiodes are the source of transfer transistors.

In one embodiment transfer transistor TXb is a metal-oxide semiconductor field-effect transistor (MOSFET), although alternative elements known in the art may also be utilized. Reset transistor 220 is coupled between power rail VDD and floating diffusion node 217 to reset sensor pixel 200 (e.g., discharge or charge floating diffusion node 217 and photodiodes PDa and PDb to a preset voltage) in response to a reset signal RST. Floating diffusion node 217 is coupled to control the gate terminal of source-follower (SF) transistor 225. Source-follower transistor 225 is coupled between power rail VDD and row select (RS) transistor 230 to amplify a signal responsive to the charge on the floating diffusion FN node 217. Row select transistor 230 couples the output of pixel circuitry from the source-follower transistor 225 to the readout column, or bit line 235, in response to a row select signal RS. Floating diffusion node 217 photodiodes PDa and PDb are (separately or together) reset by temporarily asserting the reset signal RST and transfer signals TX1 and TX2 (separately or together).

The accumulating window (e.g., exposure period) begins when the transfer signals TXa and TXb are (separately or together) de-asserted, which permits incident light to photo-generate charge in photodiode 210. As photo-generated electrons accumulate in a photodiode, its voltage decreases (electrons are negative charge carriers). The voltage or charge on the photodiode is representative of the intensity of the light incident on the photodiode during the exposure period. At the end of the exposure period, the reset signal RST is de-asserted, which turns off the reset transistor 220 and isolates floating diffusion FN node 217 from VDD. The transfer signal TX is then asserted to couple photodiode 210 to floating diffusion node 217. The charge is transferred from the photodiode to the floating diffusion FN node 217 through the transfer transistor, which causes the voltage of floating diffusion FN node 217 to drop by an amount proportional to photo-generated electrons accumulated on the photodiode during the exposure period.

In the case of the prior art example of an image sensor pixel cell with shared phase detection photodiodes illustrated in FIG. 2, the signals generated from image charges generated by photodiodes PDa and PDb may be read out in sequence and compared off-pixel to determine a difference related to the difference in incident light direction on each of the photodiodes. Such information is useful in performing an autofocus function in the imaging system.

Figure 3A:
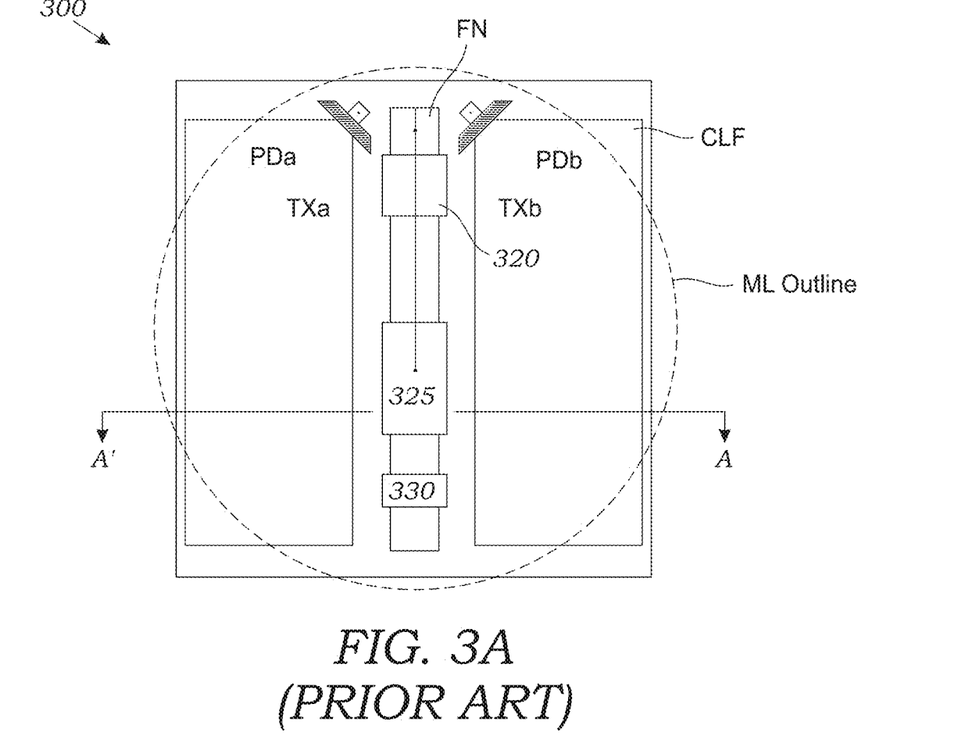
FIG. 3A is a diagram illustrating a prior art pixel cell layout wherein a pair of adjacent phase difference photodiodes share the same microlens.
Figure 3B:
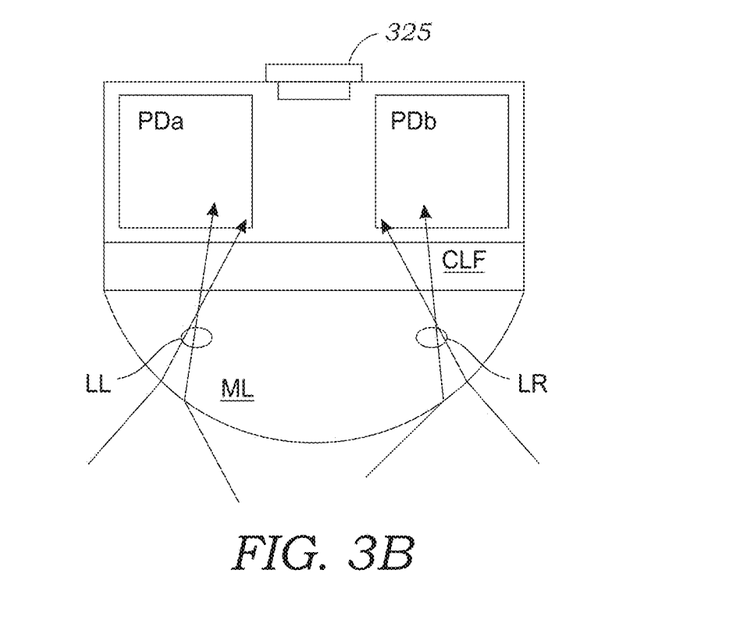
FIG. 3B is a cross section diagram of the prior art pixel cell shown in FIG. 3A.

FIG. 3A is a diagram illustrating a front side (of CMOS substrate) view of a pixel cell layout that may be used to fabricate image sensor pixel cell 300 with shared phase detection photodiodes as illustrated in FIG. 2. FIG. 3B is a cross section diagram of pixel cell 300 shown in FIG. 3A along its cross section line AA'. Photodiodes PDa and PDb and transfer transistors TXa and TXb correspond in kind to the photodiodes denoted as photodiodes PDa and PDb in FIG. 2 and the transfer transistors denoted as TXa and TXb in FIG. 2. Reset transistor 320, SF transistor 325 and row select transistor 330 shown in FIG. 3 correspond to reset transistor 220, SF transistor 225 and row select transistor 230 shown in FIG. 2. FIGS. 3A and 3B illustrate a backside illuminated (BSI) pixel wherein incident light enters the photodiodes through a backside of the substrate in which the photodiodes are formed after passing through a microlens ML and color filter CLF disposed on the backside of the substrate. A suitable alternate example, although not shown, is a frontside illuminated pixel wherein incident light enters the photodiodes through a frontside of the substrate in which the photodiodes are formed after passing through a microlens ML and color filter CLF disposed on the frontside of the substrate. Also illustrated in FIG. 3B is incident light LR entering photodiode PDb at first incident angles through the right side of microlens ML and incident light LL entering photodiode PDa at second incident angles through the left side of microlens ML. As described in regard to FIG. 2 the signals generated from image charges generated by photodiodes PDa and PDb shown in FIG. 3 may be read out in sequence and compared off-pixel to determine a difference related to the difference in incident light direction on each of the photodiodes. Such information is useful in performing an autofocus function in the imaging system.

Figure 4:
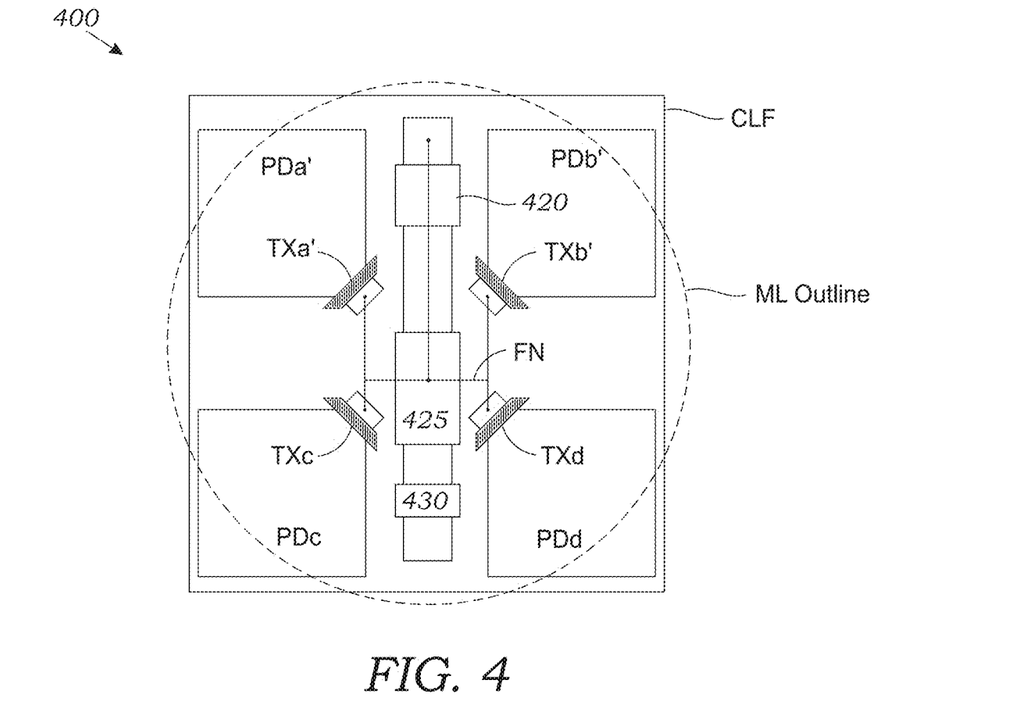
FIG. 4 is a diagram illustrating an embodiment of the invention, a pixel cell layout wherein four photodiodes share the same microlens.

FIG. 4 is a diagram illustrating a pixel cell 400 in accordance with a first embodiment of the invention. FIG. 4 illustrates pixel cell 400 which includes a two by two configuration of four photodiodes PDa', PDb', PDc, PDd and respective MOSFET transfer transistors TXa', TXb', TXc, TXd and commonly coupled floating drain FN located on the frontside of a semiconductor substrate of an image sensor wafer. Reset transistor 420, SF transistor 425 and row select transistor 430 are included in the illustration and are required to provide image signals representative of a target scene to an imaging system. Not illustrated a row select line connects at transistor 430 to deliver row select signals to transistor 430. Positioned between the photodiodes and the incident light are color filters CLF wherein label CLF designates the periphery of four color filter segments, one segment over each photodiode. Positioned between color filters CLF and incident light from an image is a plano-convex microlens ML. Not illustrated but easily imagined is an incident light ray LR entering photodiodes PDb' and PDd at first incident angle through the right side of microlens ML and incident light ray LL entering photodiodes PDa' and PDc at second incident angle through the left side of microlens ML.

Pixel cell unit 400 may be repeated to form the rows and columns of an imaging array or it may be substituted for a few normal pixel groups along rows of the imaging array. It should also be noted that since each of the photodiodes of pixel cell unit 400 have separate and independent transfer transistors each photodiode may be read out independently and therefore the imaging system resolution may be as high as the number of photodiodes. That is, each row of pixel cell units 400 comprises two rows and columns of imaging photodiodes. One benefit of this arrangement is in general the total number of rows and columns that need to be addressed in order to read out a full resolution image is reduced to half and reduces the required framerate for image processing and facilitates improved slow-motion image capture.

In maskless PFAD, pixel cell units 400 may be repeated to form the imaging array and the imaging signals from the left two photodiodes of each pixel cell can be compared to the imaging signals of the right two photodiodes of each pixel cell to accomplish the focusing function. In the invented PDAF imaging array pixel cell units 400 are modified in first instance to have photodiodes PDb' and PDd covered with an opaque mask and in a second instance to have photodiodes Pda" and PDc covered with an opaque mask. The invented PDAF imaging array then is comprised of an array of pixel cell units 400 wherein along a selected row a pixel cell modified in the first instance is substituted for a pixel cell unit 400 at a left of center position on the row and wherein a pixel cell unit modified in the second instance is substituted for a pixel cell unit 400 at a right of center position on the row.

Figure 5:
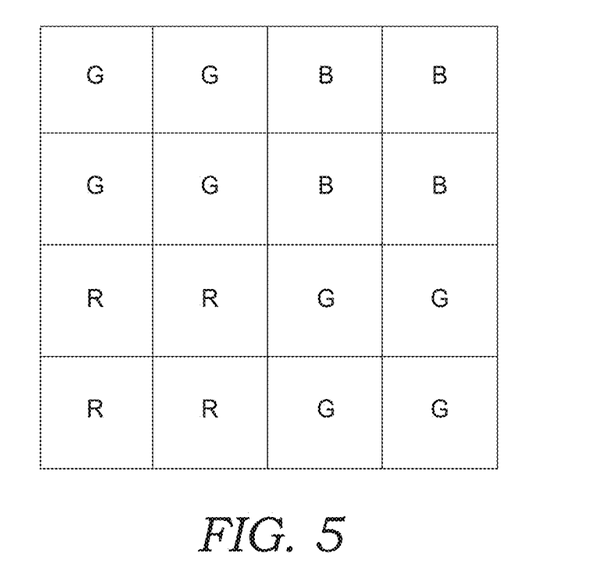
FIG. 5 illustrates a basic Bayer pattern imaging array comprising a 4 by 4 array of pixels arranged as a 2 by 2 grouping of four 2 by 2 pixel cell units with each 2 by 2 array having like color filters.

In the case wherein pixel cell unit 400 and similar non PDAF pixels are employed to form a color image sensor, light filters of various colors may be placed at each photodiode location within the incident light path rather than the same color at each group of four photodiodes as described relative to FIG. 4. A commonly known two by two arrangement of light filters is a Bayer filter pattern which consists of a red, a blue and two green filters (RGGB). In the invented imaging array wherein all four of the photodiodes configured under the single microlens ML are covered with the same type color filter Bayer pattern color imaging may also be realized by grouping four photodiodes into a pixel cell unit 400 as illustrated in FIG. 5. FIG. 5 illustrates a basic Bayer pattern imaging array comprising a 4 by 4 array of photodiodes arranged as a 2 by 2 grouping of pixel cell units 400 wherein two pixel cell units 400 have green color filters and one pixel cell unit 400 has color filter blue and one has red color filter.

Figure 6:
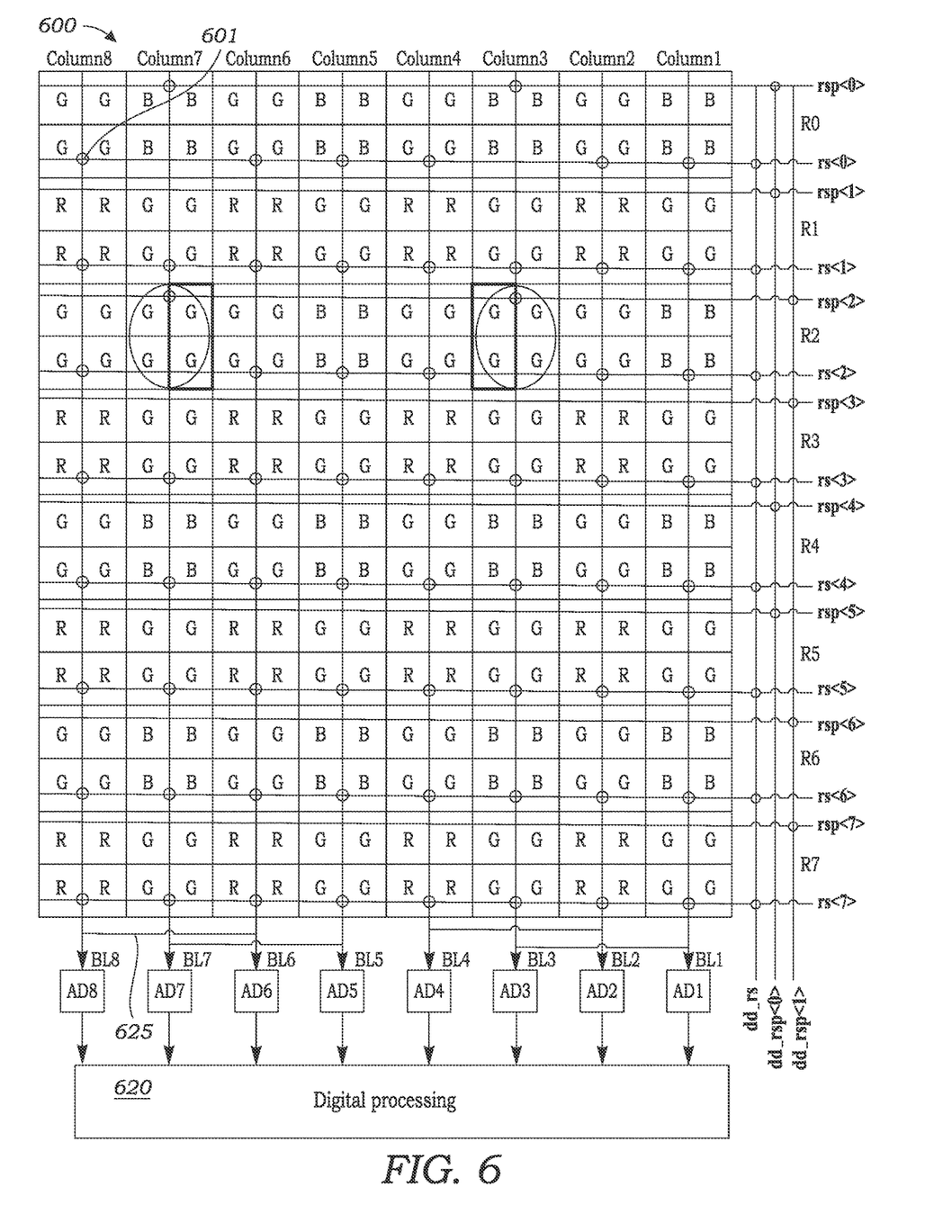
FIG. 6 is a schematic diagram of a 16 by 16 pixel array arranged as an 8 by 8 grouping of four 2 by 2 pixel cell units with like color filters with PDAF capability suitable for horizontal binning.

The novel aspect of the first embodiment of the invented PDAF imaging array is the incorporation of an additional row select line and signal scheme in order to provide for horizontal binning and the PDAF function. In more normal imaging arrays comprised of pixel cells like pixel cell 400 a single row select line and a single row select signal is sufficient for imaging. However should such an array be employed for PDAF the summed imaging signal from the four photodiodes that is transferred onto their common floating diffusion is often too large and too high to be handled by the read circuitry. Such an array would have to tradeoff full well capacity or conversion gain and ultimately signal dynamic range. In the first embodiment of the invention two row select lines are incorporated for each row of pixel cells 400 as illustrated in FIG. 6 which is a schematic diagram of a 16 by 16 photodiode array section 600 of a larger imaging array arranged as an 8 by 8 grouping of four pixel cell 400s. The four pixel cells 400 form in a Bayer color filter pattern except where a PDAF pixel cell 400 with green color filter is inserted instead of a blue filter. This array section is presented to demonstrate the invention and its features that may be scaled up in number for example by duplicating this section to comprise the larger imaging array.

FIG. 6 illustrates eight columns, Column1 to Column8 and eight rows, R0 to R7 of an imaging array segment of the first embodiment of the invented PDAF imaging array. The PDAF designated pixel cells are located on R2 at Column3 and Column7 and consist of pixel cells 400 with green color filters and opaque masks positioned over two vertically adjacent photodiodes wherein the left two such photodiodes are covered on position R2 and Column3 and wherein the right two such photodiodes are covered on position R2 and Column7. The choice of positions for the PDAF pixel cells is somewhat arbitrary except that they occupy the same row in the imaging array. FIG. 6 also illustrates eight bit lines, bitline1 to bitline8 traversing their associated pixel cells 400 and connected to each pixel cell as indicated by small circles 601. Bitline1 to bitline8 connect their respective column's image signal into A to D converters AD1 to AD8 which output to digital processing block 620.

FIG. 6 further illustrates two row select lines, rsp and rs are employed on each row in order to provide for horizontal binning and improved PDAF function, frame rate and dynamic range. R2 includes the two PDAF pixel cells and all the pixel cells in the row are one of two colors. The two row select lines are employed to control the PDAF pixel cells and the non PDAF pixel cells independently. FIG. 6 further illustrates that row select lines rs are connected to signal source dd_rs which provides an on/off control signal. Row select lines rsp are controlled by signal sources dd_rsp<0> and dd_rsp<1>. Horizontal binning, one example of which involves combining two of the nearest pixel cells with the same color filter can be achieved because as shown in FIG. 6 the odd and even columns have the same color pixel cells along their common rows and interconnection lines 625 connect the odd columns' bit lines together, i.e. BL1 and BL2, and the even columns' bit lines together, i.e. BL2 and BL4. When read out, these connections and with the proper control signals reduces to half the column data sent to the digital processor and thereby improves the framerate. Another way to describe the imaging system illustrated in FIG. 6 is an imaging system wherein pairs of the once removed adjacent column bit lines are connected together and enable horizontal binning under an appropriate sequence of the control signals provided to the three row select address lines.

Figure 7A:
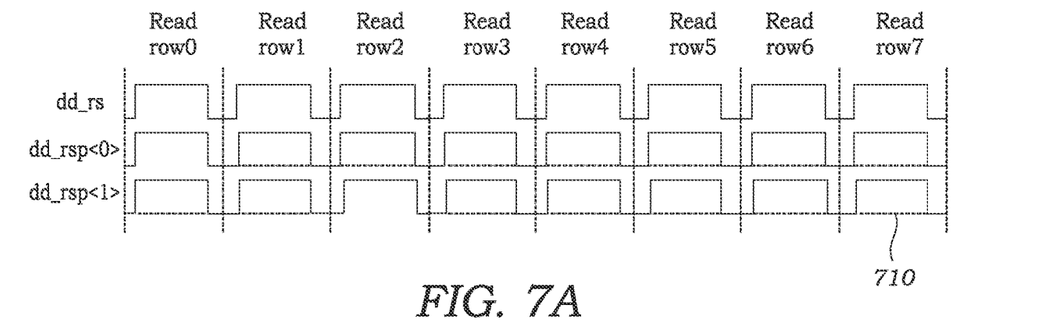
FIG. 7A illustrates the row select signal control timing in a normal working mode.

FIG. 7A illustrates the control signals dd_rs, dd_rsp<0> and dd_rsp<1> that are applied when the imaging system operates in normal mode with no horizontal binning. Specifically the line by line readout of imaging data from array segment 600 uses two sets of row select lines, that is, rs<0> to rs<7> and rsp<0> to rsp<7>. The reason for using two sets of row select lines is that during the readout of the PDAF function the color filter arrangements on rows R0 and R2 are different from the other rows. The other rows do not require two row select lines for readout but they are included in the array layout to present a uniform layout to the scene being imaged. Rows R0 and R2 are independently controlled by rs<0>, rsp<0> and rsp<2>, rsp<2> respectively.

Figure 7B:
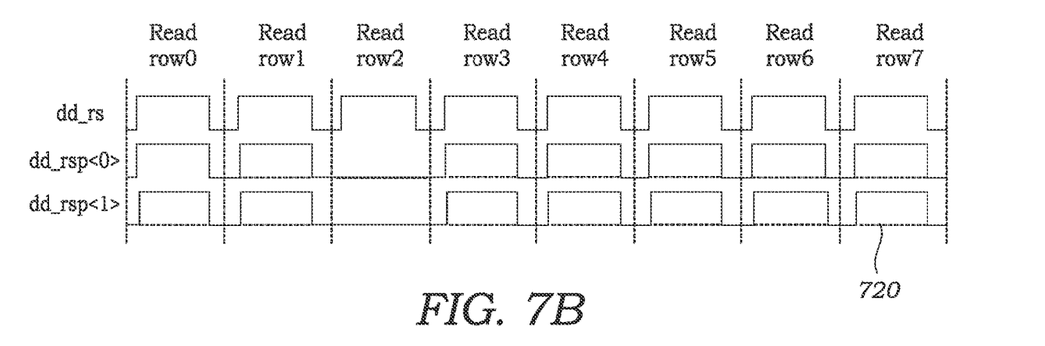
FIG. 7B illustrates the row select signal control timing in a horizontal binning mode.

FIG. 7B illustrates the states of the control signals of FIG. 7A when in horizontal binning mode. The difference is that when R0 is being read, rs<0> and rsp<0> are turned on at the same time, so all the data of R0 is read out, but the signals from R2 are not read. Although two sets of signals are used, the signals' timings are exactly the same, so R2 cannot be effectively binned horizontally because the PDAF pixel cells and normal pixel cells in the same row have different color filter blocks, so the PDAF function cannot be active during horizontal binning but the pixel cells can be used in normal mode. So all the signals in R2 need to be turned off. The two sets of row selection control lines (rs and rsp) are used to control the PDAF pixel cells and the normal pixel cells respectively, so that when the pixel array is horizontally combined and read out, the PDAF pixel row cannot be activated. Correspondingly, other pixel rows can be combined and read out through the same column line. The pixel data of the imaging array pixel cells is halved, and the frame rate is improved. Also during horizontal binning, such as column1 and column3 binning, when reading data in row0, only one of the A to D units need to be selected among column1 and column3 bitlines while the other may remain idle. The dotted line shown in FIG. 7A and FIG. 7B represent that the corresponding signal can be either a low level or a high level under this timing sequence.

Figure 8:
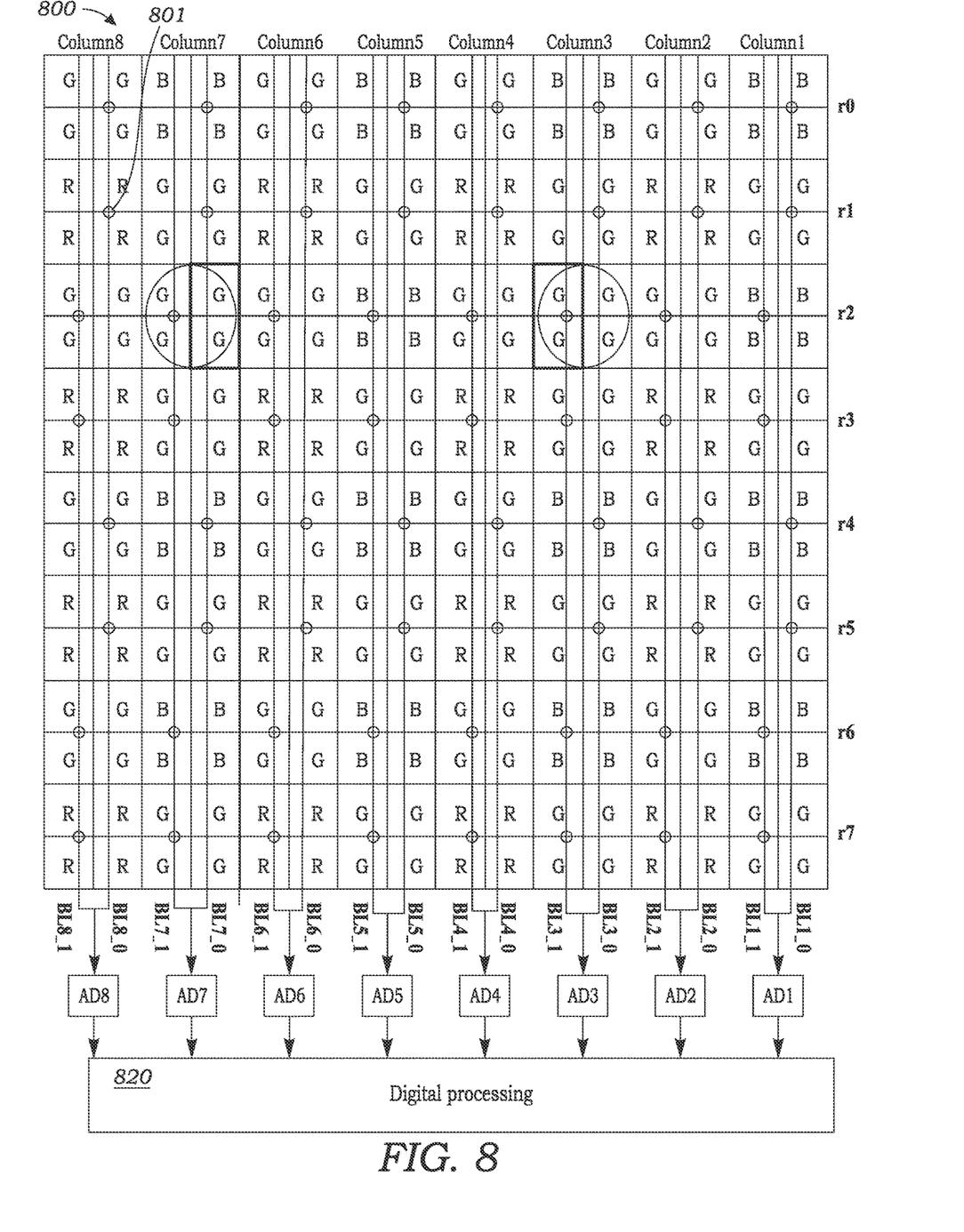
FIG. 8 is a schematic diagram of a 16 by 16 pixel array arranged as an 8 by 8 grouping of four 2 by 2 pixel cell units with like color filters with PDAF capability suitable for vertical binning.

One novel aspect of the second embodiment of the invented PDAF imaging array is the incorporation of an additional column bit line and signal scheme in order to provide for vertical binning and the PDAF function. FIG. 8 is a schematic diagram of a second embodiment of the present invention, a 16 by 16 photodiode array section 800 of a larger imaging array arranged as an 8 by 8 grouping of four pixel cell 400s with like color filters and with PDAF capability suitable for vertical binning. The features of the imaging array section illustrated in FIG. 8 that are the same as illustrated in FIG. 6 share the same or corresponding labels. The readout column connections for each row are indicated by small circles 801. A single row select line is employed for each row and it is activated by a control signal dd_rs. Employing two column bit lines per column enables two pixel cell units of the same color in different rows to be selected for combined readout. For example in column1 the blue pixel units of rows r0 and r2 can be combined and the green pixel units of rows r1 and r3 can be combined. The advantage of this invented structure is that vertical binning in effect reduces the total number of rows by half which improves frame rate and reduces pixel processing demand and improves slow-motion imaging. Rows r0 and r2 have different color block sequences, and due to the parasitic capacitance on the signal line, it is necessary to keep the surrounding environment of each pixel unit consistent. For better optimization control during readout, one row selection control line is provided for each pixel row, and two column lines are provided for each PDAF pixel Column. As shown in FIG. 8 the two column lines in Column3 are bitlines BL3_0 and BL3_1 respectively. The two column lines in Column7 are bitlines BL7_0 and BL7_1 respectively. And in order to further match each pixel column on the overall layout, two column lines are provided for all pixel columns.

Figure 9A:
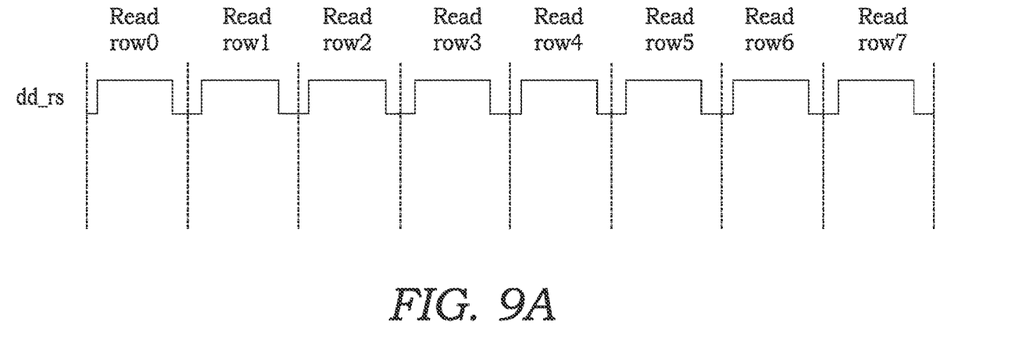
FIG. 9A illustrates the row select signal control timing in a normal working mode.
Figure 9B:
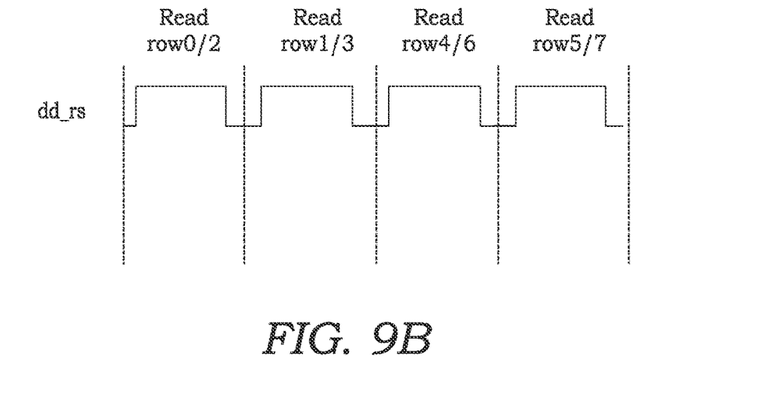
FIG. 9B illustrates the row select signal control timing in a vertical binning mode.

Therefore, in each pixel column of the second embodiment of the present invention, one pixel cell unit of the two pixel cell units that simultaneously receive the row selection control signal is read out through the first column line, and the other pixel unit is read out through the second column line. The second embodiment of the present invention simultaneously inputs the row selection signal to the pixel blocks of the pixel column and the other row, so that the two same-color pixel color blocks are simultaneously read out, thereby saving the frame rate. For example, the PDAF pixel units corresponding to the second row and the third column (r2, Column3) are read out through the first column line, and the normal pixel units corresponding to the 0th row and the third column (r0, Column3) are read out through the second column line for readout. The image sensor provided by the second embodiment of the present invention can use a group of row selection control lines to output row selection control signals, wherein the image sensor using a group of row selection control lines reads out the timing sequence in the normal working mode as shown in FIG.9A which illustrates the timing of readout control signals dd_rs for the first 8 rows. FIG. 9B shows the timing of readout control signals dd_rs in the vertical merge readout mode. In the horizontal binning mode, the order of reading is rows r0 to r7, but the number of columns in the column direction is merged as shown by the labels (Read row 0/2, etc.). As a result the data is halved, but the imaging size of the imaging pixel array is not changed, although the mage detail resolved is reduced and while the frame rate is improved.

Figure 10:
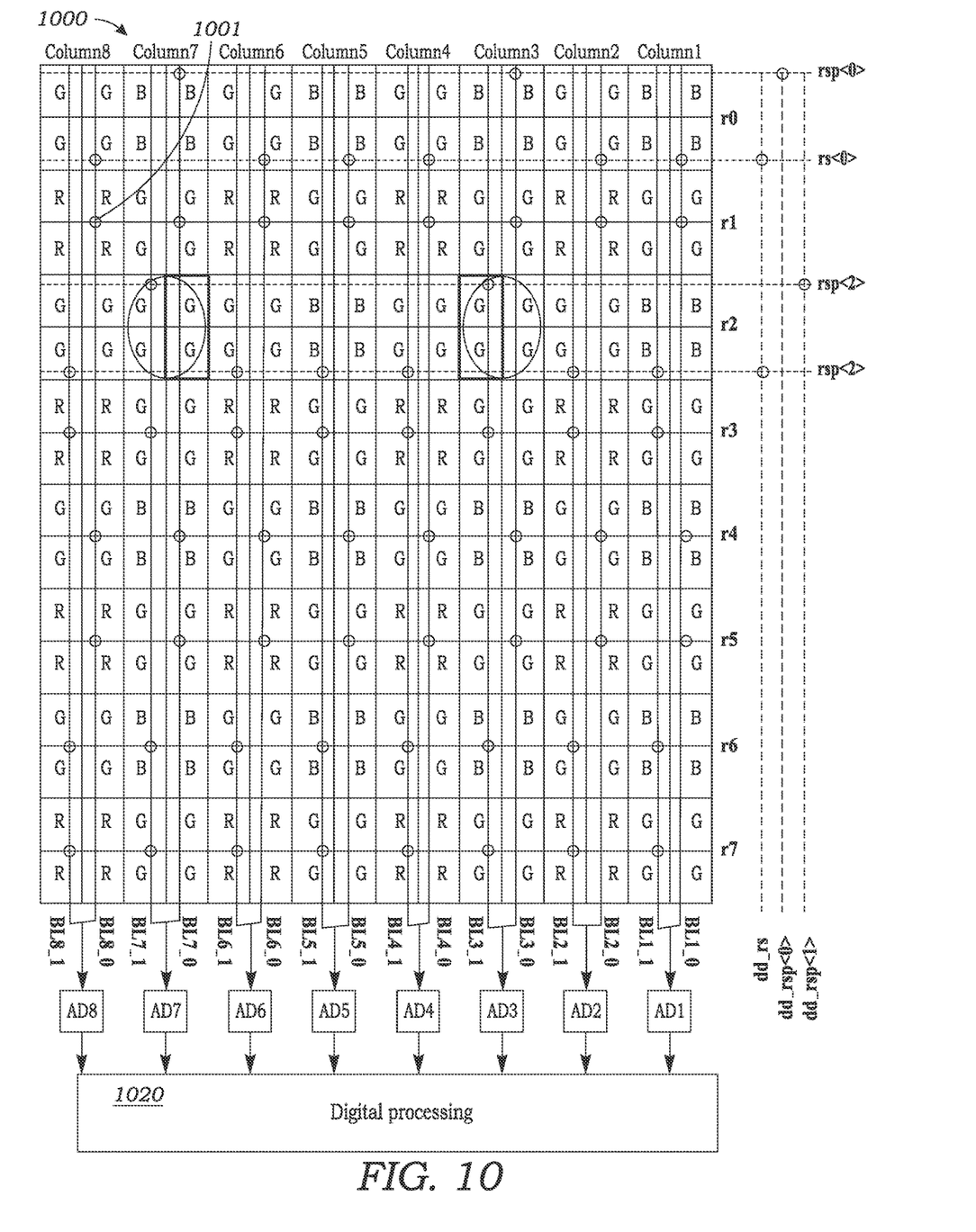
FIG. 10 is a schematic diagram of a 16 by 16 pixel array arranged as an 8 by 8 grouping of four 2 by 2 pixel cell units with like color filters with PDAF capability suitable for a combination of vertical and horizontal binning.

FIG. 10 is a schematic diagram of a third embodiment of the present invention, a 16 by 16 photodiode array section 1000 of a larger imaging array arranged as an 8 by 8 grouping of four pixel cell 400s with like color filters and with PDAF capability suitable for combined vertical binning and horizontal binning. In this embodiment of the invention the vertical binning technology is based on the double row select lines and control signals used for the horizontal binning technology of the first embodiment of the invention. In the third embodiment of the invention 2×2 pixel cell unit arrays may be implemented. Because horizontal binning makes the pixel array sparse in the column direction, there is an A to D in the column direction that is in an idle state, while the vertical binning is only binning between rows, which makes the row direction sparse. Therefore, when the combination of two row select lines and two column bit lines is employed both horizontal and vertical binning can be achieved at the same time. The circuit diagram of the actual connections used in the imaging array of the third embodiment of the invention are shown in FIG. 10. The features of the imaging array section illustrated in FIG. 10 that are the same as illustrated in FIG. 6 and FIG. 8 share the same or similarly corresponding labels. The connection points are indicated by the small circles 1001.

Figure 11A:
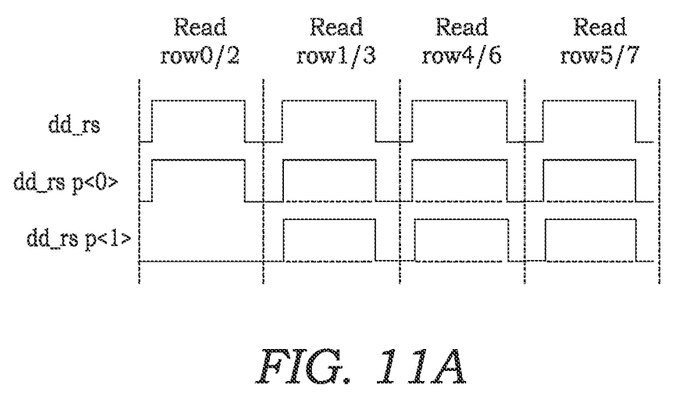
FIG. 11A illustrates the row select signal control timing for turning off the PDAF function.
Figure 11B:
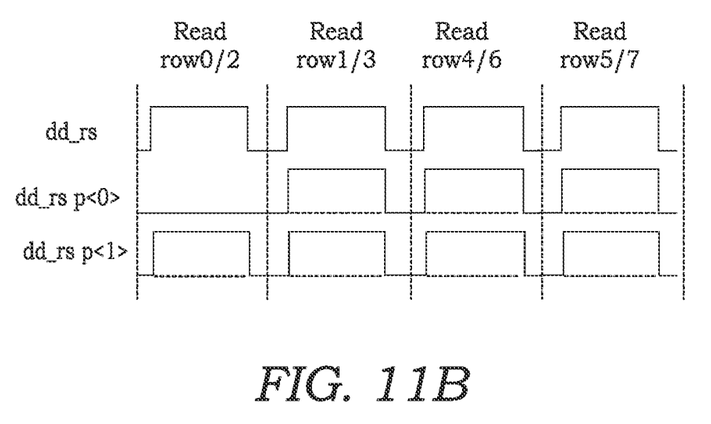
FIG. 11B illustrates the row select signal control timing for turning on the PDAF function.

FIG. 11A shows the row select signal timing for turning off the PDAF function in the third embodiment of the invention. FIG. 11B shows the row select signal timing for turning on the PDAF function in the third embodiment of the invention. The figure labels are the same or are similarly corresponding to those of FIG. 7A and FIG. 7B. The label "Read row0/2" indicates reading of the combination of pixel cell units of rows r0 and r2. The implementation is as follows. When columns column1 and column3 are horizontally binned, it is assumed that data is output through AD1 after binning, while AD3 is idle. When rows r0 and r2 and rows r1 and r3 are binned vertically at the same time, the imaging data from the four color blocks of rows r0 and r2 and columns column1 and column3 will output through AD1. At the same time as the above the imaging data of the four color blocks of rows r1 and r3 and columns column1 and column3 will output through AD3. In this way, the horizontal data of the imaging array is halved, as is the vertical data of imaging array. The imaging data in the column direction corresponding to r0 and r2, and r1 and r3, are processed at the same time. The overall effect is that the imaging data output at the same time is the same as before binning, but the overall data volume becomes 1/4 of the original. The overall benefit is that the time to process all the imaging data is also reduced to 1/4 of the original. This greatly improves the frame rate of image signal processing, making it possible to capture more slow motion. However, when binning is performed horizontally and vertically at the same time, PDAF will be turned off, and rows r3 and r0 which include the PDAF pixel cell units will be turned off, resulting in a loss of those particular pixel cell array locations in the resulting image display.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An imaging system comprising:
an array of pixel cell units arranged in rows and columns comprising:
pixel cell units each comprising a two by two configuration of four photodiodes and four respective associated transfer transistors for sensing incident light from a target scene, the transfer transistors sharing a shared floating diffusion coupled to a reset transistor and also coupled through an amplifier transistor to a single row select transistor for providing from each of the photodiodes image electrical signals representative of the target scene;
two row select lines configured to traverse each row of pixel cell units wherein a first row select line connects to the row select transistor of a first group of pixel cell units and a second row select line connects to the row select transistor of a second group of pixel cell units;
three row select address lines connected to one or both of the two row select lines in a specific arrangement to provide row select control signals to control the first and second group of pixel cell units independently wherein control signals provided to the row select lines are required to readout the electrical signals;
a color filter with the same color disposed over the four photodiodes;
a single plano-convex microlens disposed over the color filter and the four photodiodes such that light from a target scene incident on the plano-convex microlens is directed in a first direction toward the first group of pixel units and directed in a second direction toward the second group of pixel units; and
the imaging system further comprising row select control circuitry, readout circuitry, a state register controller configured to operate the control and readout circuitry in a phase detection autofocus mode, wherein the image related electrical signals from the first group of pixel cell units are read out to provide an autofocus function related to the target scene and wherein the electrical signals from every photodiode is readout with one of binning or not binning to form a full resolution image of the target scene with improved effective frame rate and improved slow motion imaging.

2. The imaging system of claim 1 wherein the first and second groups of pixel units are Phase Detection Auto Focus (PDAF) pixel cell units which occupy the same row wherein an opaque mask covers one of the first and second vertically adjacent pairs of photodiodes.

3. The imaging system of claim 2 wherein the PDAF pixel cell units are formed by replacing blue pixels or red pixels with green pixels in the Bayer array and the PDAF pixel cell units occupy 3% of the Bayer array area.

4. The imaging system of claim 2 wherein in the array of pixel cell units also comprises a single bit line connected to the output of the row select transistors of all the pixel cell units in a common column wherein the row select transistors associated with the PDAF pixel cell units, including any pixel cells modified for uniformity of layout, are driven by the first row select line and the remainder of the pixel cell units are driven by the second row select line.

5. The imaging system of claim 4 wherein the first row select line is provided control signals by a first and second of the three row select address lines and the second row select line is provided control signals by the third row select address line.

6. The imaging system of claim 5 wherein pairs of the once removed adjacent column bit lines, for example the first and third, second and fourth, fifth and seventh, sixth and eighth, etc., column bit lines are connected together in those pairings and enable horizontal binning under an appropriate sequence of the control signals provided to the three row select address lines.

7. The imaging system of claim 6 wherein during the horizontal binning mode the pixel row where the PDAF pixel cell unit does not perform pixel signal readout.

8. The imaging system of claim 5 wherein pairs of the once removed adjacent column bit lines are connected together and enable horizontal binning under an appropriate sequence of the control signals provided to the three row select address lines.

9. The imaging system of claim 2 wherein in the array of pixel cell units also comprises two read out bit lines connected to the output of the row select transistors of the pixel cell units in a common column wherein a first bit line is connected to pixel cell units in the adjacent rows row0 and row1, row4 and row5, etc., and wherein a second bit line is connected to pixel cell units in adjacent rows row2 and row3, row6 and row7, etc.; wherein the electrical signals from every photodiode is readout with both horizontal and vertical binning to form an a full resolution image of the target scene with improved effective frame rate and improved slow motion imaging.

10. The imaging system of claim 1 wherein each pixel cell resides within a substrate comprising a front surface and a back surface and wherein each pixel is configured to receive light from the target scene through comprises a 4 backside illuminated pixel cell for imaging light incident on the back surface of the pixel substrate.

11. The imaging system of claim 1 wherein each pixel cell resides within a substrate comprising a front surface and a back surface and wherein each pixel is configured to receive light from the target scene through comprises a frontside illuminated pixel cell for imaging light incident on the front surface of the pixel substrate.

12. An imaging system comprising:
an array of pixel cell units arranged in rows and columns comprising:
pixel cell units each comprising a two by two configuration of four photodiodes and four respective associated transfer transistors, for sensing incident light from a target scene, the transfer transistors sharing a shared floating diffusion coupled to a reset transistor and also coupled through an amplifier transistor to a single row select transistor for providing from each of the photodiodes image electrical signals representative of the target scene;
a single row select line configured to traverse each row of pixel cell units connecting to the row select transistor of each group of pixel cells along rows of the array;
a row select address line connected to the row select line providing a row select control signal to control the pixel cell units wherein control signals provided to the row select line is required to readout the electrical signals;
a color filter with the same color disposed over the four photodiodes; a single plano-convex microlens disposed over the color filter and the four photodiodes such that light from a target scene incident on the plano-convex microlens is directed in a first direction the first group of pixel units and directed in a second direction toward the second group of pixel units, two read out bit lines connected to the output of the row select transistors of the pixel cell units in a common column wherein a first bit line is connected to pixel cell units in the adjacent rows row0 and row1, row4 and row5, etc., and wherein a second bit line is connected to pixel cell units in adjacent rows row2 and row3, row6 and row7, etc.; and
the imaging system further comprising row select control circuitry, readout circuitry, a state register controller configured to operate the control and readout circuitry in a phase detection autofocus mode, wherein the image related electrical signals from the first group of pixel cell units are read out to provide an autofocus function related to the target scene and wherein the electrical signals from every photodiode is readout with one of vertical binning or not vertical binning to form a full resolution image of the target scene with improved effective frame rate and improved slow motion imaging.

13. The imaging system of claim 12 wherein the first and second groups of pixel units are Phase Detection Auto Focus (PDAF) pixel cell units which occupy the same row wherein an opaque mask covers one of the first and second vertically adjacent pairs of photodiodes.

14. The imaging system of claim 12 wherein each pixel cell resides within a substrate comprising a front surface and a back surface and wherein each pixel is configured to receive light from the target scene through comprises a 4 backside illuminated pixel cell for imaging light incident on the back surface of the pixel substrate.

15. The imaging system of claim 12 wherein each pixel cell resides within a substrate comprising a front surface and a back surface and wherein each pixel is configured to receive light from the target scene through comprises a frontside illuminated pixel cell for imaging light incident on the front surface of the pixel substrate.

16. The imaging system of claim 12 wherein in the array of pixel units also comprises two row select lines configured to traverse each row of pixel cell units wherein a first row select line connects to the row select transistor of the first group of pixel cell units and a second row select line connects to the row select transistor of the second group of pixel cell units;
the row select transistors associated with the PDAF pixel cell units, including any pixel units modified for uniformity of layout, are driven by the first row select line and the remainder of the pixel cell units are driven by the second row select line; and
wherein the electrical signals from every photodiode is readout with both horizontal and vertical binning to form an a full resolution image of the target scene with improved effective frame rate and improved slow motion imaging.

17. The imaging system of claim 16 wherein three row select address lines connected to one or both of the two row select lines in a specific arrangement to provide row select control signals to control the first and second group of pixel cell units independently wherein control signals provided to the row select lines are required to readout the electrical signals; and
the first row select line is provided control signals by a first and second of the three row select address lines and the second row select line is provided control signals by the third row select address line.

18. A method for providing with an imaging system an optionally selectable autofocus function mode with binning or without binning mode for an array of pixel cell units, the method comprising the steps of:
providing an array of pixel cell units arranged in rows and columns, each pixel cell unit comprising a two by two configuration of four photodiodes and four respective associated transfer transistors for sensing incident light from a target scene, the transfer transistors sharing a shared floating diffusion coupled to a reset transistor and also coupled through an amplifier transistor to a single row select transistor for providing from each of the photodiodes image electrical signals representative of the target scene;
providing two row select lines configured to traverse each row of pixel cell units wherein a first row select line connects to the row select transistor of a first group of pixel cell units and a second row select line connects to a row select transistor of the second group of pixel cell units;
providing three row select address lines connected to one or both of the two row select lines in a specific arrangement to provide row select control signals to control the first and second group of pixel cell units independently wherein control signals provided to the row select lines are required to readout the electrical signals;
providing a single color filter over the four transfer transistors and their respective four photodiodes;
providing a single plano-convex microlens positioned over the single color filter and the four photodiodes such that light from a target scene incident on the plano-convex microlens is directed in a first direction toward the first group of pixel units and directed in a second direction toward the second group of pixel units;
providing two read out bit lines connected to the output of the row select transistors of the pixel cell units in a common column wherein a first bit line is connected to pixel cell units in the adjacent rows row0 and row1, row4 and row5, etc., and wherein a second bit line is connected to pixel cell units in adjacent rows row2 and row3, row6 and row7, etc.; and providing a control and readout circuit and a state register controller configured to operate the control and readout circuit in either a first phase difference detection mode without binning or a second phase difference detection mode wherein the electrical wherein the electrical signals from every photodiode is readout with both horizontal and vertical binning to form an a full resolution image of the target scene with improved effective frame rate and improved slow motion imaging.

* * * * *